United States Patent
Mita

(10) Patent No.: US 6,987,030 B2
(45) Date of Patent: Jan. 17, 2006

(54) METHOD OF MANUFACTURING SEMICONDUCTOR DEVICE

(75) Inventor: Kiyoshi Mita, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 68 days.

(21) Appl. No.: 10/814,063

(22) Filed: Mar. 31, 2004

(65) Prior Publication Data

US 2004/0253769 A1  Dec. 16, 2004

(30) Foreign Application Priority Data

Jun. 13, 2003   (JP) ...................................... 2003-168581

(51) Int. Cl.
*H01L 21/44* (2006.01)
*H01L 21/48* (2006.01)
*H01L 21/50* (2006.01)

(52) U.S. Cl. ................... 438/106; 438/122; 438/124; 438/127

(58) Field of Classification Search ................ 438/25, 438/26, 51, 106, 107, 108, 121, 122, 124–127
See application file for complete search history.

(56) References Cited

U.S. PATENT DOCUMENTS

| | | | | |
|---|---|---|---|---|
| 5,424,250 A | * | 6/1995 | Sawada | ...................... 438/127 |
| 6,352,879 B1 | * | 3/2002 | Fukui et al. | ................ 438/106 |
| 6,475,629 B1 | * | 11/2002 | Takeuchi et al. | ............ 428/450 |
| 6,562,660 B1 | * | 5/2003 | Sakamoto et al. | .......... 438/124 |

* cited by examiner

*Primary Examiner*—Asok Kumar Sarkar
(74) *Attorney, Agent, or Firm*—Fish & Richardson

(57) ABSTRACT

The method of manufacturing the semiconductor device includes the steps of forming terminal portions convexly protruding on a surface of first conductive foil by etching the first conductive foil except portions to become terminals, superimposing a resin sheet on the first conductive foil such that the terminal portions are embedded in the resin sheet, constructing a laminated sheet by superimposing second conductive foil having a resin layer formed on a back thereof, on the resin sheet with the resin layer faced down, forming a conductive pattern by etching the second conductive foil, electrically connecting the conductive pattern and the terminal portions, electrically isolating the terminal portions from each other, firmly fixing a semiconductor element to the laminated sheet and electrically connecting the semiconductor element and the conductive pattern, and forming sealing resin on a surface of the laminated sheet such that the semiconductor element is covered by the sealing resin.

5 Claims, 6 Drawing Sheets

METHOD OF MANUFACTURING SEMICONDUCTOR DEVICE

BACKGROUND OF THE INVENTION

The present invention relates to a method of manufacturing a semiconductor device.

Referring to FIGS. 12A and 12B, a semiconductor device of known types will be described. FIG. 12A is a cross-sectional view of a semiconductor device 100, and FIG. 12B is a bottom view thereof.

Referring to FIG. 12A, electrodes 104 made of copper foil or the like are formed on the top face of a supporting substrate 101 made of glass epoxy or the like. Further, on the back of the supporting substrate 101, back electrodes 105 are formed and connected to the electrodes 104 through via-holes 106. Moreover, the electrodes 104 and the back electrodes 105 are covered by plated films 109.

A semiconductor element 102 as a semiconductor element is firmly fixed on the supporting substrate 101 and connected to the electrodes 104 using fine metallic wires 103. Further, sealing resin 107 is formed such that the sealing resin 107 covers the semiconductor element 102.

Referring to FIG. 12B, on the back of the supporting substrate 101, the back electrodes 105 are provided in two lines parallel to the periphery of the supporting substrate 101.

In the aforementioned semiconductor device 100, since the supporting substrate 101 has been adopted, the thinning and miniaturization thereof have limitations. Further, thermal stresses have been generated by the change in the temperature in usage situations, and the reliability of connection paths from the back electrodes 105 to the electrodes 104 has had a problem. Moreover, the supporting substrate 101 is necessary to adhere the electrodes 104 and the back electrodes 105 to each other in a manufacturing process, and it has been difficult to manufacture a semiconductor device without this. Furthermore, since the supporting substrate 101 has the role of absorbing thermal stresses, it has been difficult to construct a semiconductor device without the supporting substrate 101.

SUMMARY OF THE INVENTION

The embodiment present invention has been accomplished in light of the above-described problems. A main object of the present invention is to provide a method of manufacturing a semiconductor device in which miniaturization and thinning can be achieved and which is excellent in the connection reliability of terminal portions.

The method of preferred embodiment includes the steps of forming terminal portions convexly protruding on a surface of first conductive foil by etching the first conductive foil except portions to become terminals, superimposing a resin sheet on the first conductive foil such that the terminal portions are embedded in the resin sheet, constructing a laminated sheet by superimposing second conductive foil on the resin sheet, forming a conductive pattern by etching the second conductive foil, electrically connecting the conductive pattern and the terminal portions, electrically isolating the terminal portions from each other, firmly fixing a semiconductor element to the laminated sheet and electrically connecting the semiconductor element and the conductive pattern, and forming sealing resin on a surface of the laminated sheet such that the semiconductor element is covered by the sealing resin.

Moreover, according to the embodiment, the terminal portions are electrically isolated from each other by etching the first conductive foil from a back thereof.

Moreover, according to the embodiment, the resin sheet is made of soluble resin, and in which side surfaces of the terminal portions are exposed by removing the resin sheet.

Moreover, according to the embodiment, the semiconductor element is connected face-up, and in which an electrode of the semiconductor element and the conductive pattern are connected through a fine metallic wire.

Moreover, according to the embodiment, the semiconductor element is mounted face-down, and in which an electrode of the semiconductor element and the conductive pattern are connected through a bump electrode.

DESCRIPTION OF THE PREFERRED EMBODIMENT

Figure 1A:
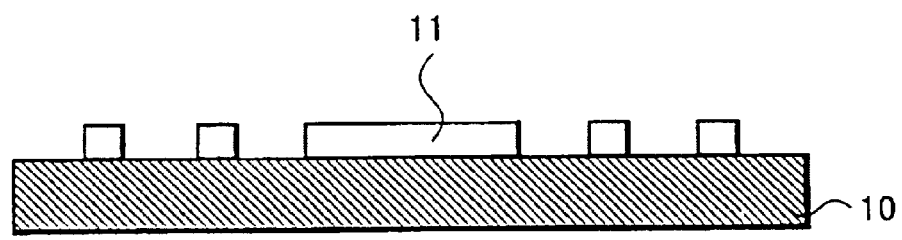
FIGS. 1A and 1B are cross-sectional views showing a method of manufacturing a semiconductor device of the present invention.

Hereinafter, a method of manufacturing a semiconductor device of the present embodiment will be described in detail with reference to drawings. The method of manufacturing the semiconductor device of the present embodiment includes the steps of forming terminal portions 12 convexly protruding on a surface of first conductive foil 10 by etching the first conductive foil 10 except portions to become terminals 12, superimposing a resin sheet 14 on the first conductive foil 10 such that the terminal portions 12 are embedded in the resin sheet 14, constructing a laminated sheet 18 by superimposing second conductive foil 16 having a resin layer 15 formed on a back thereof, on the resin sheet 14 with the resin layer 15 faced down, forming a conductive pattern 17 by etching the second conductive foil 16, electrically connecting the conductive pattern 17 and the terminal portions 12, electrically isolating the terminal portions 12 from each other, firmly fixing a semiconductor element 22 to the laminated sheet 18 and electrically connecting the semiconductor element 22 and the conductive pattern 17, and forming sealing resin 24 on a surface of the laminated sheet 18 such that the semiconductor element 22 is covered by the sealing resin 24. Each of these steps will be described below.

Figure 1B:
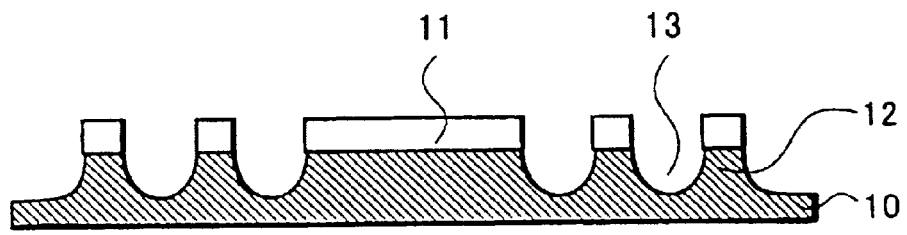

Referring to FIGS. 1A and 1B, a first step of the present embodiment is to form terminal portions 12 convexly protruding on the surface of first conductive foil 10 by etching the first conductive foil 10 except portions to become the terminals 12.

Referring to FIG. 1A, the first conductive foil 10 containing metal, such as copper or aluminum, as a chief material is prepared. The thickness of the first conductive foil 10 is set in the range in which the terminal portions 12 can be formed in a later step. Then, etching resist 11 is formed on the surface of the first conductive foil 10 in the areas except the portions where the terminal portions 12 are to be formed. The terminal portions 12 are convexly formed by wet etching or dry etching.

Referring to FIG. 1B, in the first conductive foil 10 in the portions where the first conductive foil 10 is exposed through the etching resist 11, isolation grooves 13 are formed. In particular, in the case where wet etching has been performed, the side surfaces of the terminal portions 12 become curved, the adhesion strength with a resin member is improved in a later step. Thus, the terminal portions 12 are convexly formed. After the etching has been performed, the etching resist 11 is removed.

Figure 2:
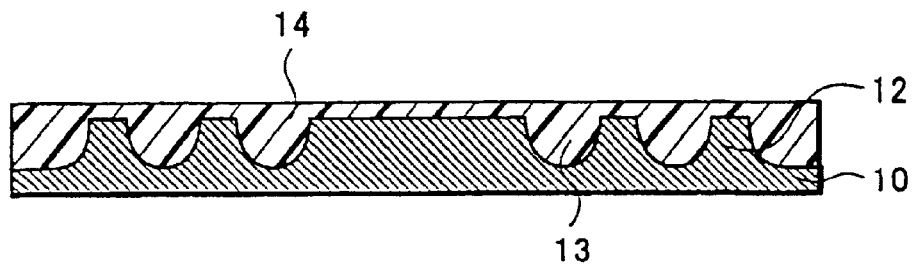
FIG. 2 is a cross-sectional view showing the method of manufacturing the semiconductor device of the present invention.

Referring to FIG. 2, a second step of the present embodiment is to superimpose a resin sheet 14 on the first conductive foil 10 such that the terminal portions 12 are embedded in the resin sheet 14. As the resin sheet 14, a B-stage prepreg sheet in which a glass cloth is impregnated with resin can be used. Moreover, this superimposing work can be performed by a vacuum press.

Figure 3:
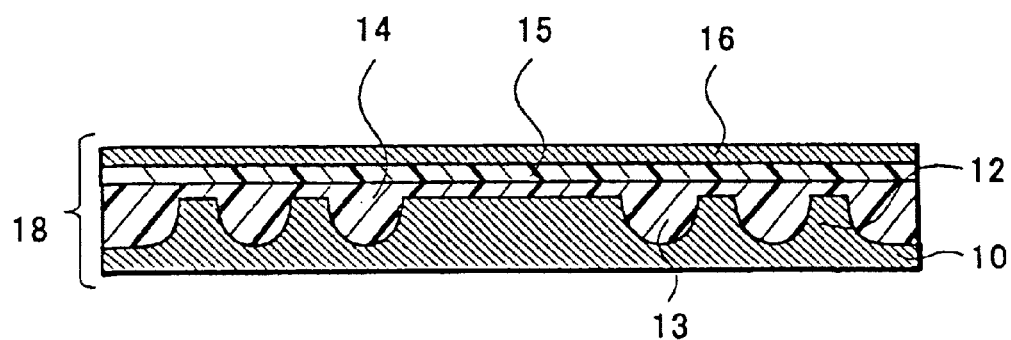
FIG. 3 is a cross-sectional view showing the method of manufacturing the semiconductor device of the present invention.

Referring to FIG. 3, a third step of the present embodiment is to construct a laminated sheet 18 by superimposing second conductive foil 16 having a resin layer 15 formed on the back thereof, to the resin sheet 14 with the resin layer 15 faced down. Here, as the resin layer 15, a prepreg sheet as described above can be used. In addition, as the second conductive foil 16, conductive foil thinner than the first conductive foil can be adopted so that a fine pattern can be formed. Moreover, as a material for the second conductive foil 16, metal containing copper or aluminum as a chief material can be adopted similar to the first conductive foil 10. In this step, the laminated sheet 18 in which the first conductive foil 10 having the terminal portions 12 and the second conductive foil 16 are laminated with resin interposed therebetween, is formed.

Figure 4:
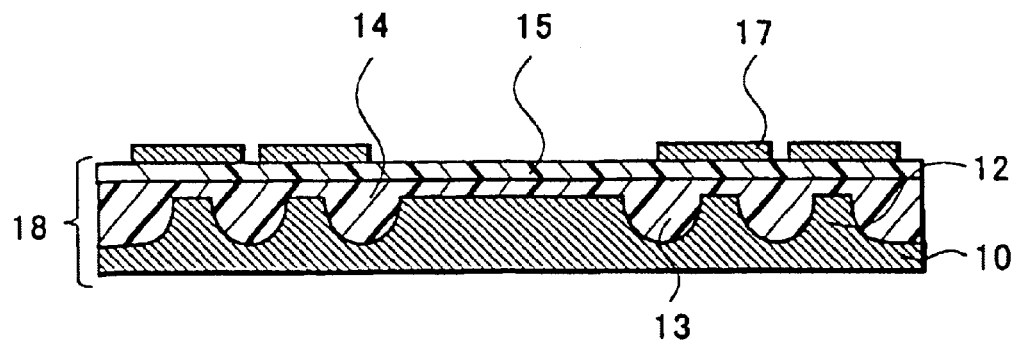
FIG. 4 is a cross-sectional view showing the method of manufacturing the semiconductor device of the present invention.

Referring to FIG. 4, a fourth step of the present embodiment is to form a conductive pattern 17 by etching the second conductive foil 16. Here, the second conductive foil 16 is also selectively removed by dry etching or wet etching which uses etching resist.

Figure 5:
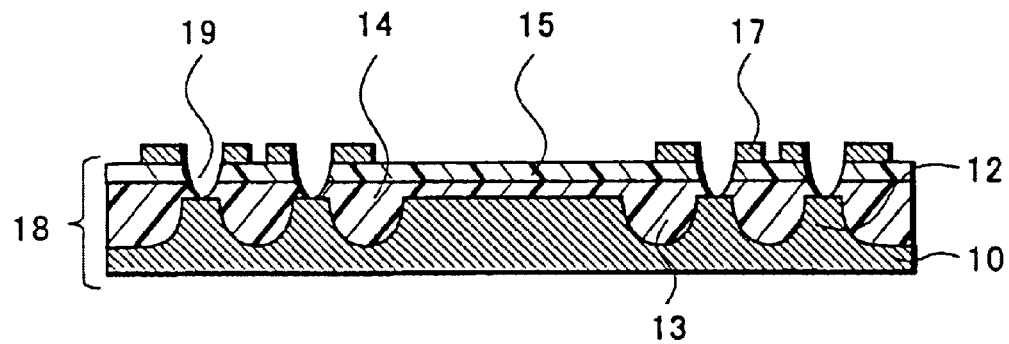
FIG. 5 is a cross-sectional view showing the method of manufacturing the semiconductor device of the present invention.
Figure 6:
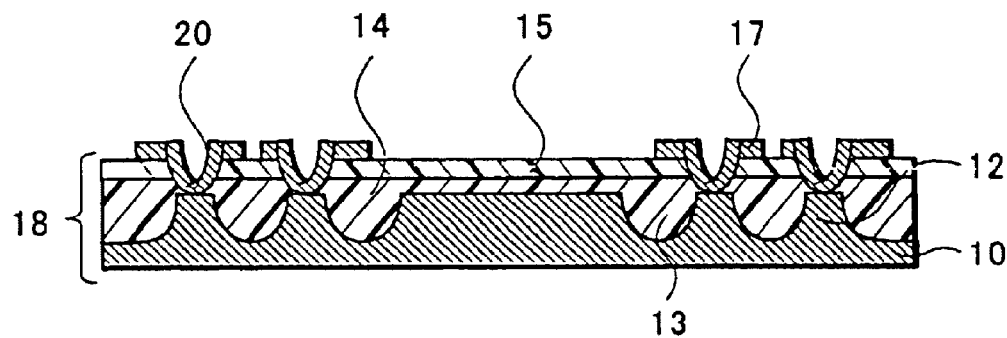
FIG. 6 is a cross-sectional view showing the method of manufacturing the semiconductor device of the present invention.

Referring to FIGS. 5 and 6, a fifth step of the present embodiment is to electrically connect the conductive pattern 17 and the terminal portions 12. First, referring to FIG. 5, through-holes 19 penetrating the conductive pattern 17, the resin layer 15, and the resin sheet are pierced. Methods of forming the through-holes 19 include a method in which etching and laser are used. First, the conductive pattern 17 in the portions where the through-holes 19 are to be formed is partially removed by etching. Then, the resin layer 15 and the resin sheet 14 under the removed conductive pattern 17 are removed by applying laser light. As the laser used here, a carbon dioxide gas laser can be adopted.

Next, referring to FIG. 6, connection portions 20 are formed in the through-holes 19 formed by the above-described method. First, resin residues in the through-holes 19 formed in the foregoing step are removed (desmear) by cleaning. Then, the connection portions 20 made of metal, such as copper, are formed on the side surfaces of the through holes 19 by electroless plating or electrolytic plating. By these connection portions 20, the conductive pattern 17 and the terminal portions 12 are electrically connected. Here, filling plating may be performed to fill the through-holes 19 with plating material.

Figure 7:
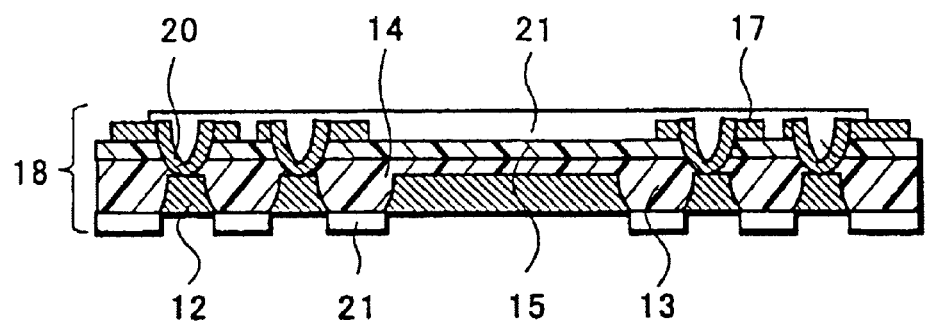
FIG. 7 is a cross-sectional view showing the method of manufacturing the semiconductor device of the present invention.

Referring to FIG. 7, a sixth step of the present embodiment is to electrically isolate the terminal portions 12 from each other. Specifically, the back of the first conductive foil 10 is removed until the resin sheet 14 filling the isolation grooves 13 is exposed, whereby each terminal portion 12 becomes electrically independent. This step can be performed by wet etching the back of the first conductive foil 10 overall. Moreover, the back of, the laminated sheet 18 except the portions where the terminal portions 12 are exposed is covered by resist 21. Further, the surface of the conductive pattern 17 may also be covered by the resist 21, except for portions electrically connected to a built-in element.

Figure 8:
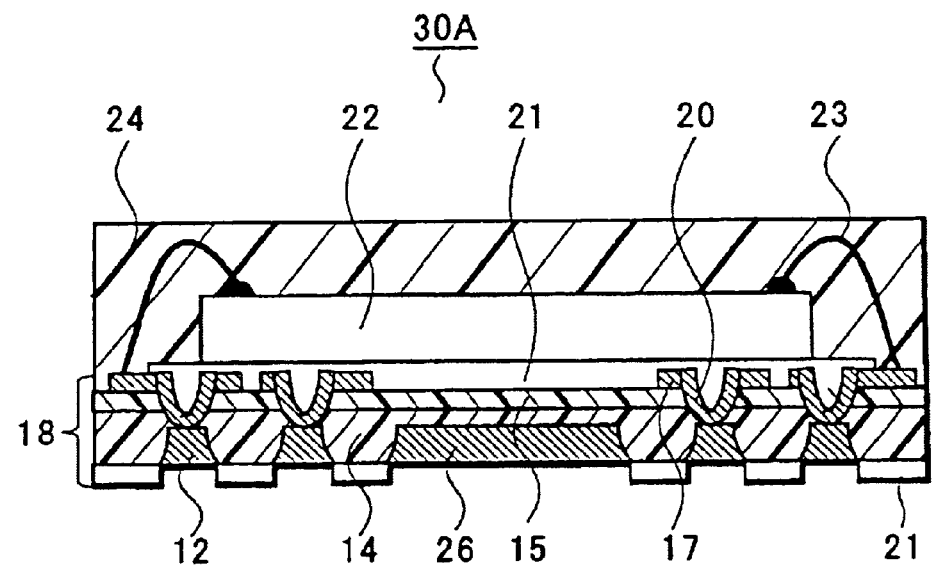
FIG. 8 is a cross-sectional view showing the method of manufacturing the semiconductor device of the present invention.

Referring to FIG. 8, a seventh step of the present embodiment is to electrically connect the semiconductor element 22 and the conductive pattern 17 and to form sealing resin 24 on the surface of the laminated sheet 18 such that the semiconductor element 22 is covered by the sealing resin 24. The semiconductor element 22 is firmly fixed on the laminated sheet 18 with an adhesive interposed therebetween, and electrodes of the semiconductor element 22 and the conductive pattern 17 are electrically connected through thin metallic wires 23. The sealing resin 24 is formed on the surface of the laminated sheet 18 such that the sealing resin 24 covers the semiconductor element 22 and the thin metallic wires 23.

The semiconductor device 30A is manufactured by the above-described steps and surface-mounted on a mount board or the like in the state where solder material, such as solder, is attached to the back of the exposed terminal portions 12. Moreover, a heat releasing electrode 26 is formed below the semiconductor element 22, whereby heat release properties of the entire device are improved. Furthermore, the semiconductor device 30A has a multilayered wiring configuration, and a fine circuit pattern can be formed as the conductive pattern 17 formed from the thin second conductive foil. In addition, the first conductive foil 10 constituting the terminal portions 12 is thickly formed and therefore has the function of supporting the whole until the step of plastic molding.

Figure 9:
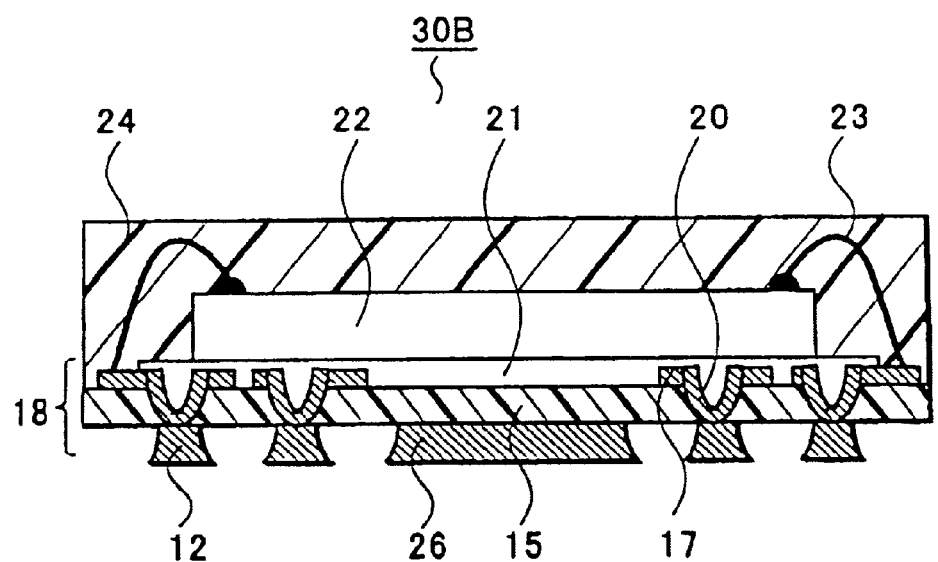
FIG. 9 is a cross-sectional view showing the method of manufacturing the semiconductor device of the present invention.

Referring to FIG. 9, the structure of a semiconductor device 30B of another configuration will be described. Here, the resin sheet 14 is removed, and a structure in which the side surfaces of the terminal portions 12 are exposed is adopted. Therefore, a semiconductor device having terminal portions 12 of the PIN type is formed. In this case, the resin sheet 14 is made of alkaline soluble resin, and the resin sheet 14 is removed by dissolving the resin sheet 14 in an alkaline agent after each terminal portion 12 has been isolated.

Figure 10:
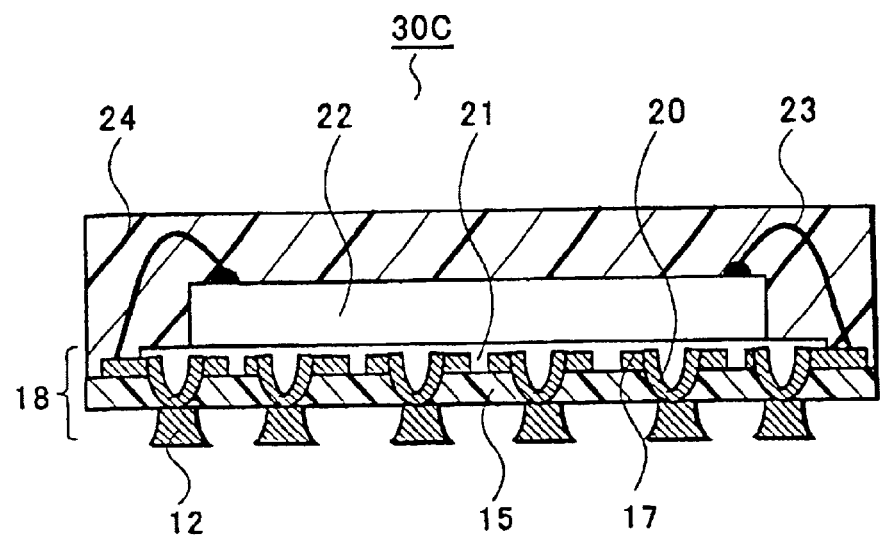
FIG. 10 is a cross-sectional view showing the method of manufacturing the semiconductor device of the present invention.

Referring to FIG. 10, a semiconductor device 30C of another configuration will be described. Here, an electrode for heat release is not formed, but terminal portions 12 of the PIN type are formed in the form of a grid. Therefore, a semiconductor device having a multi-pin configuration can be provided.

Figure 11:
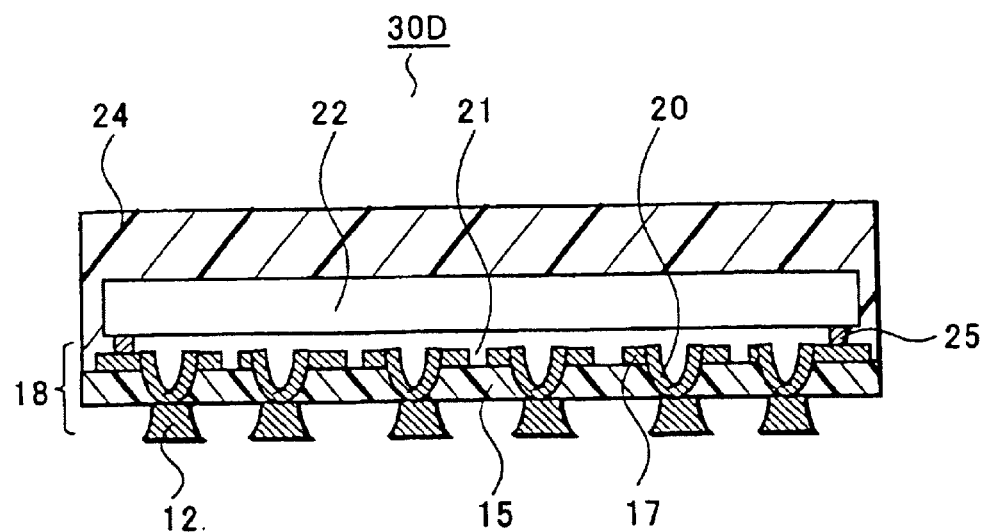
FIG. 11 is a cross-sectional view showing the method of manufacturing the semiconductor device of the present invention.
Figure 12A:
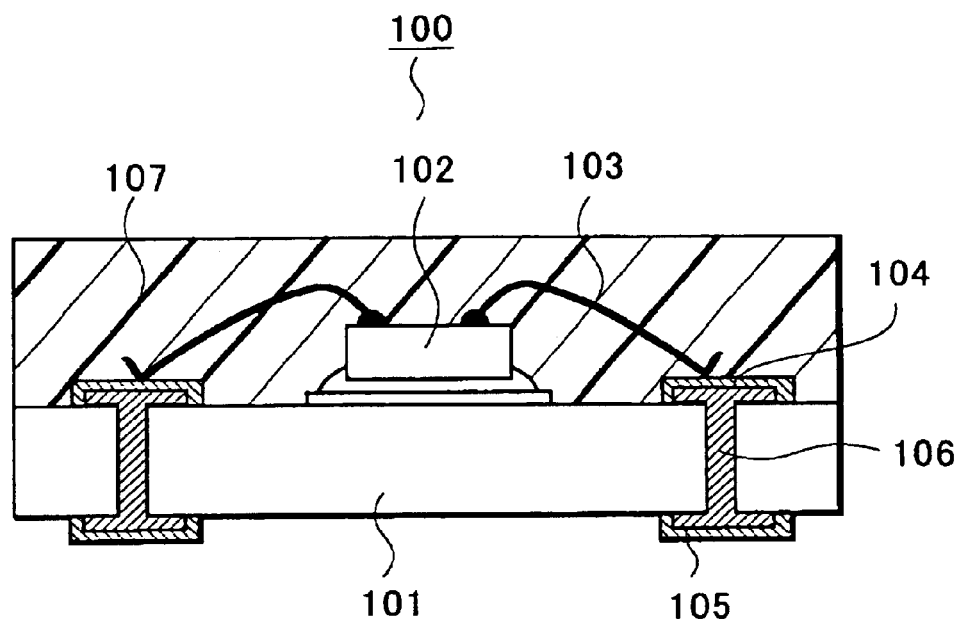
FIGS. 12A and 12B are a cross-sectional view and a bottom view showing a known semiconductor device.
Figure 12B:
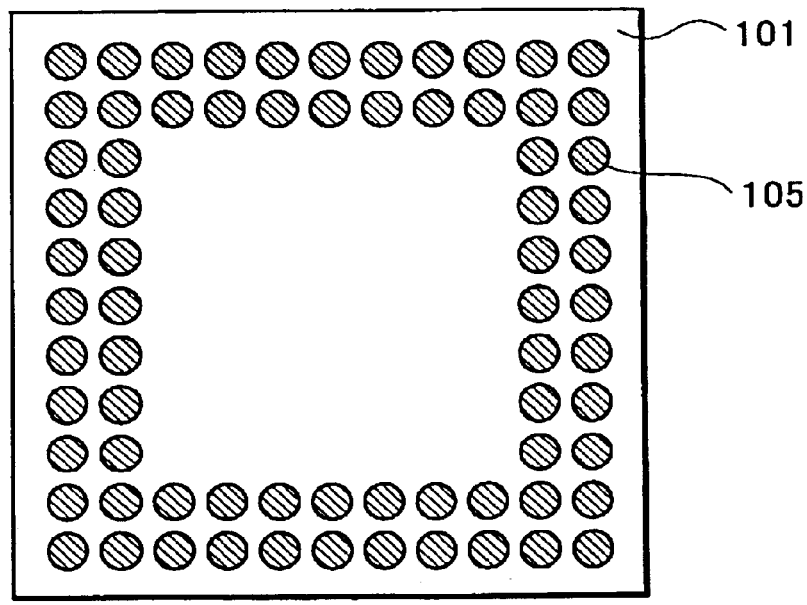

Referring to FIG. 11, a semiconductor device 30D of another configuration will be described. Here, the semiconductor element 22 is mounted face-down and electrically connected to the conductive pattern 17 through bump electrodes 25. As described previously, since a fine pattern can be formed as the conductive pattern 17, the conductive pattern 17 can sufficiently cope with the case where the pitch of electrodes of the semiconductor element 22 is narrow.

Incidentally, the present embodiment previously described can be variously modified without departing from the scope of the present embodiment. For example, modifications below can be performed.

Referring to FIG. 2, here, the resin sheet 14 has been laminated to the first conductive foil. However, here, a resin sheet 14 laminated to copper foil can be used. This makes the resin sheet 14 and the resin layer 15 become the same resin member, referring to FIG. 3. Therefore, the components constituting the semiconductor device can be reduced.

The present embodiment can bring about effects as described below.

The first conductive foil 10 constituting the terminal portions 12 and the second conductive foil 16 constituting the conductive pattern have been laminated with the resin layer interposed therebetween to constitute the multilayered laminated sheet 18. Therefore, it is possible to manufacture a semiconductor device which eliminates the need for a supporting substrate of a known example and which has a multilayered wiring configuration.

Moreover, a terminal configuration of the PIN type in which the side surfaces of terminal portions are exposed can be obtained by adopting soluble resin as the resin for laminating the first and second conductive foil 10 and 16.

What is claimed is:

1. A method of manufacturing a semiconductor device, comprising:
   forming terminal portions convexly protruding on a surface of first conductive foil by etching the first conductive foil except portions to become terminals;
   superimposing a resin on the first conductive foil such that the terminal portions are embedded in a resin sheet;
   constructing a laminated sheet by superimposing second conductive foil on the resin sheet;
   forming a conductive pattern by etching the second conductive foil;
   electrically connecting the conductive pattern and the terminal portions;
   electrically isolating the terminal portions from each other;
   fixing a semiconductor element to the laminated sheet and electrically connecting the semiconductor element and the conductive pattern; and
   forming sealing resin on a surface of the laminated sheet such that the semiconductor element is covered by the sealing resin.

2. The method according to claim 1, wherein the terminal portions are electrically isolated from each other by etching the first conductive foil from a back thereof.

3. The method according to claim 1, wherein the resin sheet is made of soluble resin, and the terminal portions are exposed by removing the resin sheet.

4. The method according to claim 1, wherein the semiconductor element is fixed face-up, and an electrode of the semiconductor element and the conductive pattern are connected through a fine metallic wire.

5. The method according to claim 1, wherein the semiconductor element is mounted face-down, and an electrode of the semiconductor element and the conductive pattern are connected through a bump electrode.

* * * * *